United States Patent
Sahu

(10) Patent No.: US 9,455,028 B1
(45) Date of Patent: Sep. 27, 2016

(54) ADAPTIVE NEGATIVE BIT LINE WRITE ASSIST

(71) Applicant: QUALCOMM Incorporated, San Diego, CA (US)

(72) Inventor: Rahul Sahu, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/860,916

(22) Filed: Sep. 22, 2015

(51) Int. Cl.
  *G11C 11/00* (2006.01)
  *G11C 11/419* (2006.01)
  *G11C 5/14* (2006.01)
  *G11C 7/12* (2006.01)

(52) U.S. Cl.
  CPC ............ *G11C 11/419* (2013.01); *G11C 5/145* (2013.01); *G11C 7/12* (2013.01)

(58) Field of Classification Search
  CPC ............ G11C 5/145; G11C 7/12; G11C 8/08
  USPC ........................................ 365/154, 226, 149
  See application file for complete search history.

(56) References Cited

U.S. PATENT DOCUMENTS

| | | |
|---|---|---|
| 8,023,351 B2 | 9/2011 | Hirabayashi |
| 8,233,342 B2 | 7/2012 | Adams et al. |
| 8,411,518 B2 | 4/2013 | Janardan et al. |
| 8,964,490 B2 | 2/2015 | Chow et al. |
| 2012/0163110 A1* | 6/2012 | Sinha ..................... G11C 7/227 365/203 |
| 2015/0131364 A1 | 5/2015 | Hsieh et al. |
| 2015/0279454 A1* | 10/2015 | Sano ........................ G11C 7/12 365/189.09 |
| 2016/0118091 A1* | 4/2016 | Asenov .................... G11C 7/22 365/194 |

\* cited by examiner

*Primary Examiner* — Han Yang
(74) *Attorney, Agent, or Firm* — Haynes and Boone, LLP

(57) ABSTRACT

A memory is provided with a write assist circuit that responds to an indication that a write operation on a modeled memory cell is successful by releasing a negative bit line boost.

20 Claims, 5 Drawing Sheets

ADAPTIVE NEGATIVE BIT LINE WRITE ASSIST

TECHNICAL FIELD

This application relates to memories, and more particularly to a memory having an adaptive negative bit line write assist.

BACKGROUND

A static random access memory (SRAM) bitcell includes a pair of cross-coupled inverters. Each cross-coupled inverter includes a PMOS transistor that can charge a true (Q) data node or complement (QB) data node. The Q node couples through an NMOS access transistor to the a bit line whereas the QBdata node couples through another NMOS access transistor to a complement bit line. During a write operation in which the binary content of the bitcell is changed, one of the PMOS transistors will initially be on and charging its data node while the corresponding access transistor is attempting to discharge the same node through the corresponding bit or complement bit line. The NMOS access transistor must thus be relatively strong with regard to the corresponding PMOS transistor in the inverter so that the data node can be discharged relatively quickly despite the struggle with the PMOS transistor. To strengthen the NMOS access transistor, it is conventional to provide a negative voltage on the corresponding bit line instead of just grounding this bit line during the write operation. This negative voltage increases the strength of the NMOS access transistor in comparison to the inverter PMOS transistor so that the NMOS access transistor can quickly discharge the corresponding data node.

A coupling capacitor is conventionally used to provide the negative voltage to the bit line. This can be problematic in that the negative boost to the bit line is dependent upon not only the coupling capacitance but also the bit line capacitance, which will vary depending upon the number of bit cells in a given memory configuration and process corner. Depending upon the memory configuration and process corner, the negative boost may be too small, resulting in write failure. Conversely, the negative boost may be too large, resulting in device damage.

Accordingly, there is a need in the art for improved negative bit line assist architectures.

SUMMARY

To release a negative bit line boost, a memory is provided with a write assist circuit. The write assist circuit includes a capacitor having a first terminal coupled to a negative bit line boost terminal for providing a negative bit line boost to a discharged bit line in a bit line pair during a write operation to an accessed memory cell. An inverter in the write assist circuit drives a second terminal of the capacitor to initiate the negative bit line boost to the discharged bit line. A switch couples between a ground terminal for the inverter and ground. The switch is configured to switch off so as to isolate the ground terminal from ground responsive to a boost track signal that is asserted responsive to a completion of a successful write operation to a dummy memory cell. The dummy memory cell is configured so that the successful write operation is completed substantially simultaneously with a successful write operation to the accessed memory cell.

The isolation of the ground terminal for the inverter causes the terminal of the capacitor to float so as to terminate the negative bit line boost to the discharged bit line. This is quite advantageous in that it doesn't matter what the particular process, voltage, or temperature corner is for the memory, the resulting variation in the completion of the successful write operation to the accessed memory cell will be mimicked by the dummy memory cell (or cells). The result is that a duration for the negative bit line boost is timed so as to be released upon completion of a successful write operation to the accessed memory cell. The conventional problems of having too short or too long of a negative bit line boost are thus solved.

These and other advantageous features may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

A memory write assist circuit is provided that resets (terminates) a negative bit line boost responsive to a successful write operation to a memory cell. The reset is a process, voltage, and temperature (PVT)-aware reset as will be explained further herein. Due to this reset, it doesn't matter what process corner, temperature, or voltage variation is being experienced by a given memory nor does it matter how many bit cells load a given column—the negative bit line boost will be applied such that it terminates upon completion of a write operation to an accessed memory cell. The reset of the negative bit line is thus adaptive to the process corner, temperature, and voltage variations.

Figure 1:
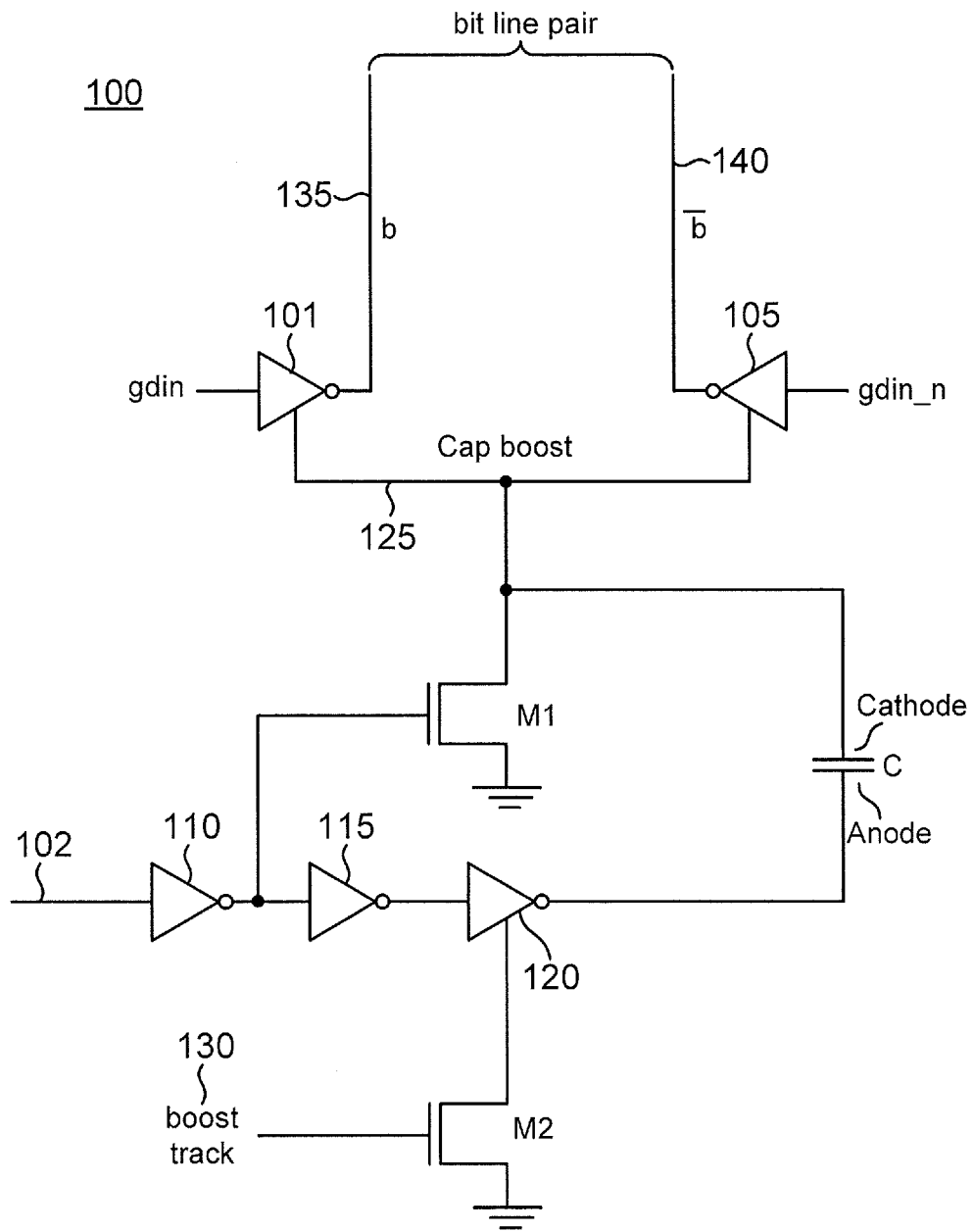
FIG. 1 is a circuit diagram of a write assist circuit in accordance with an aspect of the disclosure.

An example write assist circuit 100 shown in FIG. 1 is configured to apply this timed negative bit line boost. A pair of complementary write signals gdin and gdin_n represent the binary value of a bit (q) to be written into a static random access memory (SRAM) memory cell (not illustrated) that couples to a pair of bit lines formed by a true bit line (b) 135 and a complement bit line (b bar) 140. A negative boost signal 102 initiates a negative bit line boost during a write operation. In this implementation, negative boost signal 102 is an active high signal such that a bit line boost operation is initiated by asserting negative boost signal 102 from its default grounded state to a power supply voltage level. An inverter 110 inverts negative boost signal 102 to drive an inverter 115 and a gate of an NMOS transistor M1. During default operation outside of the bit line boost period, transistor M1 is thus turned on. The source of transistor M1 couples to ground whereas its drain acts as a ground terminal (denoted herein as cap boost terminal 125) for a pair of inverters 101 and 105. Inverter 101 inverts write signal gdin to drive true bit line 135. Similarly, inverter 105 inverts complement write signal gdin_n to drive complement bit line 140. Due to the complementary nature of the write signals, one of inverters 101 and 105 will keep its bit line charged whereas the other will ground its bit line through cap boost terminal 125 while transistor M1 is conducting.

Given this control of cap boost terminal 125 by negative boost signal 102, cap boost terminal 125 will float with respect to ground after being discharged when negative boost signal 102 is asserted high (e.g., asserted to a power supply voltage). But cap boost terminal 125 also couples to a cathode terminal of a capacitor C. With regard to an anode terminal for capacitor C, inverter 115 drives an inverter 120 that in turn drives the anode of capacitor C. During default operation outside of the negative bit line boost operation, the low state (ground) for negative boost signal 102 thus keeps the anode of capacitor C maintained at the power supply voltage driving inverter 120 whereas the cathode remains grounded since cap boost terminal 125 is grounded. But when negative boost signal 102 is asserted high, the anode terminal is grounded. The stored charge in capacitor C then causes its cathode terminal to be pulled to a negative voltage, which causes cap boost terminal 125 to be pulled negative as well. Inverters 110, 115, 120 as well as transistors M1 and M2 may be deemed to comprise a means for coupling a terminal of the capacitor C to ground to initiate a negative bit line boost operation responsive to an assertion of negative boost signal 1052 and for floating the terminal to terminate the negative bit line boost operation responsive to an assertion of a boost track signal 130.

The negative boost to cap boost terminal 125 causes the bit line that was grounded (either true bit line 135 or complement bit line 140 depending upon the binary state for write signals gdin and gdin_n) to be pulled to the negative voltage as well. The negative bit line boost is applied for a negative bit line boost period. To avoid the problems with timing the negative bit line boost period such as by making it too short or too long, a boost track signal 130 is asserted in response to a completion of a successful write operation as will be discussed further herein to reset (terminate) the negative bit line boost by switching off an NMOS transistor M2 whose drain acts as a ground terminal for inverter 120. During default operation outside of the negative bit line boost period, boost track signal 130 is maintained at the power supply voltage such that transistor M2 is maintained on. Since the source of transistor M2 is grounded, transistor M2 maintains the ground terminal for inverter 120 at ground while boost track signal 130 is de-asserted to the power supply voltage. In this implementation, boost track signal 130 is an active low signal such that it is asserted by being discharged to ground (pulled low). In response, transistor M2 switches off whereupon the anode terminal for capacitor C floats since inverter 120 no longer couples to ground through its ground terminal. This causes a release of the negative bit line boost. This release is responsive to the completion of a successful write operation using the modeling discussed further herein. It thus doesn't matter what process corner is used to construct the memory, nor does it matter what the power supply voltage level is, nor does it matter whether the memory is hot or cold—the negative bit line boost will be released at the appropriate time across the various process, voltage, and temperature (PVT) corners.

Figure 2:
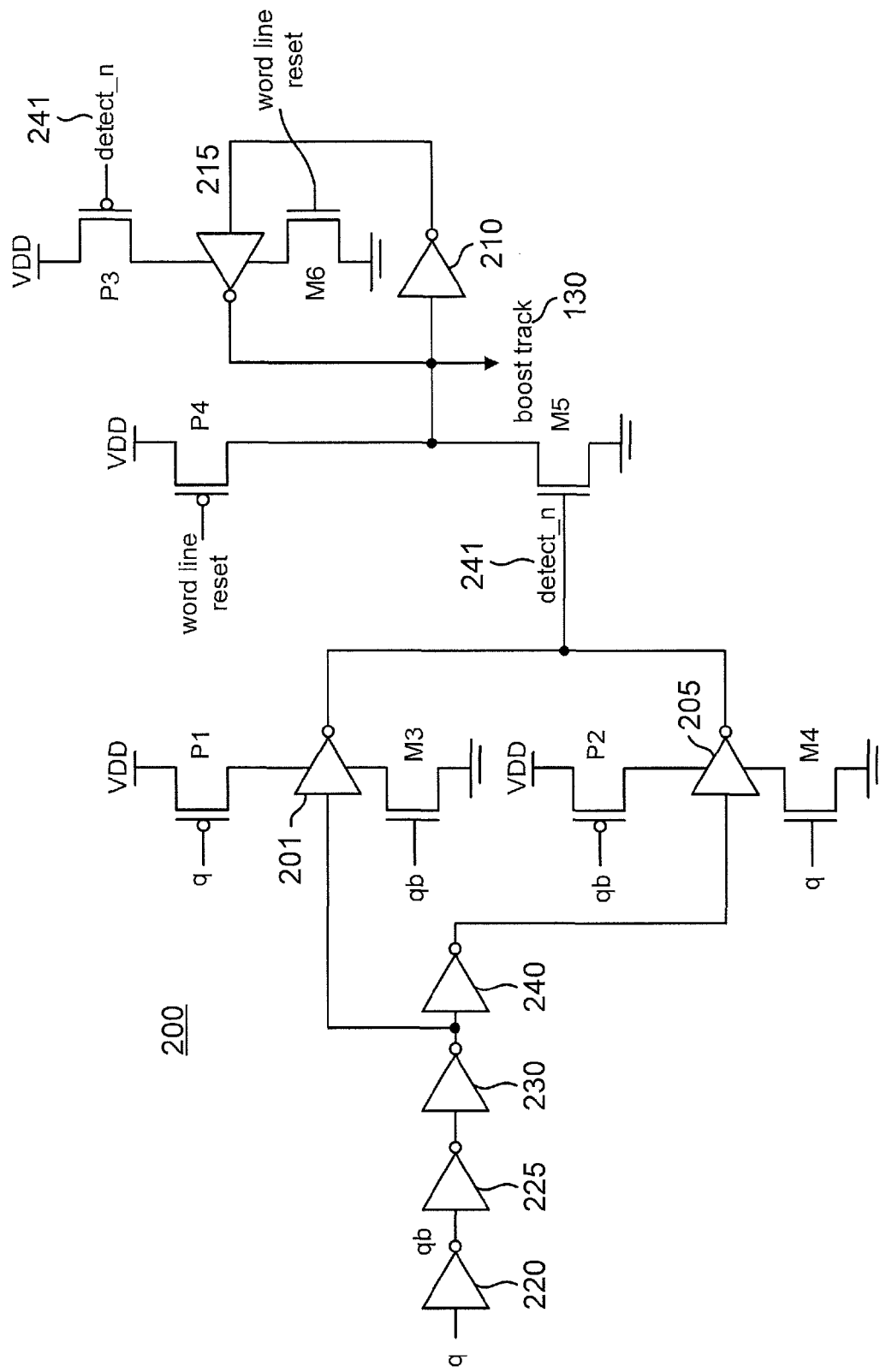
FIG. 2 is a circuit diagram of a write detect circuit in accordance with an aspect of the disclosure.

A write detect circuit 200 for generating boost track signal 130 responsive to a modeled successful write operation is shown in FIG. 2. A q signal comes from a memory tracking circuit discussed and illustrated below. The q signal may also be denoted herein a dummy memory cell output signal as it represents the binary state of a dummy memory cell (or cells). This signal has a guaranteed binary transition for every write operation as will be discussed further herein. Thus, if the q signal had been high, it will be discharged for the subsequent write operation. Conversely, if the q signal had been low, it will be asserted to the power supply voltage VDD for the subsequent write operation. To assert boost track signal 130 regardless of whether the q signal transitions high or low, the q signal drives a gate of a PMOS transistor P1 that has its source tied to a power supply node providing a power supply voltage VDD and has its drain coupled to a power supply terminal for an inverter 201. A ground terminal for inverter 201 couples to a drain of an NMOS transistor M3 that has its source tied to ground. A complement of the q signal (qb) drives a gate of transistor M3 so that inverter 201 is operational (both powered and grounded) when the q signal is low. In contrast, the qb signal drives a gate of a PMOS transistor P2 that has its sourced tied to the power supply node VDD and its drain coupled to a power supply terminal for an inverter 205. Similarly, the q signal drives a gate of an NMOS transistor M4 that has its source tied to ground and a drain coupled to a ground terminal for inverter 205. Inverter 205 is thus complementary to inverter 201 in that inverter 205 is operational when the q signal is high.

An inverter 220 inverts the q signal to produce the qb signal. An inverter 225 inverts the qb signal to produce a first delayed version of the q signal which in turn is inverted by an inverter 230 to produce a delayed version of the qb signal. An inverter 240 inverts the delayed version of the qb signal to produce a second delayed version of the q signal. Inverter 201 inverts the delayed version of the qb signal produced by inverter 230 into a detect_n signal. Similarly, inverter 205 inverts the second delayed version of the q signal produced by inverter 240 into the detect_n signal, which is thus commonly driven by both inverter 201 and inverter 205. The detect_n signal drives a gate of an NMOS transistor M5 having is source tied to ground and its drain coupled to a node 241 supplying boost track signal 130. The voltage for boost track signal 130 will thus equal the drain voltage for transistor M5. A PMOS transistor P4 has its source tied to the power supply voltage node and its drain coupled to node 241. An active-low word line reset signal drives the gate of transistor P4 so that boost track signal 130 is charged to the power supply voltage VDD after the release of the word line (not illustrated) during a write operation. During default operation, this charged state for boost track signal 130 is maintained by write detect circuit 200. For example, when the q signal is high during the default state, inverter 205 grounds the detect_n signal to maintain transistor M5 off so that boost track signal 130 may remain charged signal. In the same fashion, inverter 201 will ground the detect_n signal during default operation when the q signal is low. It thus doesn't matter what binary state the q signal has during the default state, the detect_n signal will be discharged prior to a write operation. Since the detect_n signal drives the gate of transistor M5, transistor M5 will be off during the default state (no active write operation).

As will be explained further herein, a successful write operation to an accessed memory cell is modeled by a dummy memory cell or cells that results in a binary transition of the q signal (the dummy memory cell output signal). Thus, if the q signal had been high (charged to the power supply voltage VDD) prior to the write operation, it will then be driven low (discharged to ground) when a successful write operation has been modeled. Similarly, if the q signal had been low prior to a write operation, it will be driven high upon the conclusion of a successful simulated write operation. The q signal is thus guaranteed to have a binary transition responsive to the completion of a simulated (or modeled) write operation. Regardless of how the q signal transitions at the completion of the write operation to the dummy memory cell(s), boost track signal 130 will be pulled low upon conclusion of the successful simulated write operation. For example, should the q signal be pulled low upon completion of the successful write operation, inverter 201 will be switched on while inverter 205 is switched off. At that time, delayed version of the complement q signal from inverter 230 will still be low since the changed state of the q signal takes time to propagate through inverters 220, 225, and 230. The detect_n signal will thus be initially driven high in response to the binary transition of the q signal such that transistor M5 turns on to discharge boost track signal 130 to ground. Similarly, should the q signal transition high upon conclusion of the successful simulated write operation, inverter 205 will switch on while inverter 201 is switched off. At that time, the second delayed version of the q signal produced by inverter 240 will still be low due to the propagation delay across the serial combination of inverters 220, 225, 230, and 240. The detect_n signal will thus also be pulsed high so that transistor M5 switches on to discharge boost track signal 130. Referring again to write assist circuit 100 (FIG. 1), the negative boost to the discharged bit line through cap boost node 125 will thus be terminated upon completion of the successful simulated write operation so that the negative bit line boost has the proper duration regardless of the process, voltage, and temperature corner. As the changed state of the q signal propagates through the serial combination of inverters 220, 225, 230, and 240, the assertion of the detect_n signal will be released such that it is again discharged to ground. For example, suppose that the q signal had transitioned high. The second delayed version of the q signal produced by inverter 240 will thus eventually transition high, whereupon the detect_n signal is discharged. A similar release of the detect_n signal occurs if the q signal had transitioned low.

A latch formed by cross-coupled inverters 210 and 215 in write detect circuit 200 latches boost track signal 130 when both the word line reset signal and the detect_n signal are de-asserted. In particular, the word line reset signal drives a gate of an NMOS transistor M6 having its source tied to ground and its drain coupled to a ground terminal for inverter 215. The ground to inverter 215 will thus be maintained while the word line reset signal is de-asserted high (the corresponding word line being asserted) during the write operation. Similarly, the detect_n signal drives a gate of a PMOS transistor P3 having its source tied to the power supply node and its drain coupled to a power supply terminal for inverter 215. Power will thus be provided to inverter 215 while the detect_n signal is de-asserted low during default operation. The latch formed by inverters 215 and 210 is opened when the detect_n signal is driven high and closed when the detect_n signal is released. The low state of the boost track signal 130 is thus latched and maintained until the earliest of either the word line reset signal being de-asserted high upon release of the word line or until the detect_n signal is again discharged. In one implementation, write detect circuit 200 may be deemed to comprise a means for asserting the boost track signal responsive to the binary transition in the dummy memory cell output (the binary transitions of the q signal).

The simulation of the successful write operation will now be discussed with regard to an example memory 300 of FIG. 3. An m×n array 305 of memory cells (for example, SRAM bitcells) has m columns and n rows (m and n being positive integers). Each column has a corresponding bit line pair (BL and BLB). The plurality of m columns in array 305 are arranged from a zeroth column to an (m−1)th column. Each bit line pair is driven by a corresponding write assist circuit 100 as discussed with regard to FIG. 1. The write signals gdin and gdin_n for each column's write assist circuit 100 are supplied by a corresponding write driver circuit 320. Based upon the binary value to be written to an accessed memory cell, each write driver circuit 320 drives its write signals gdin and gdin_n with the corresponding binary values. For example, write driver circuit 320 for the zeroth column responds to a D0 binary value whereas write driver circuit 320 for the (m−1)th column responds to a Dm−1 binary value.

A memory control circuit (CNTL) 340 responds to a clock signal 355 and an address signal 356 to drive negative boost signal 102 and the word line reset signal as is conventional in the negative bit line boost arts. In addition, memory control circuit 340 triggers word line decoder circuits 345 to decode the address signal and assert the appropriate word line (WL) ranging from a zeroth word line WL0 to an (n−1)th word line (WLn). These word lines control the n rows in memory array 305. To simulate the time necessary for the word line development during a write operation, memory control circuit 340 also triggers a dummy word decoder 350 at the same time word lines decoders 345 are triggered to decode the row address. For example, memory control circuit 340 may trigger dummy word line decoder 350 using one or more predecoder (PREDECs) signals 357. In response, dummy word line decoder 350 asserts a dummy word line (DWL) that is loaded by a dummy row of memory cells 310. To limit the routing area demands, the dummy word line DWL may be folded. Regardless of whether the dummy word line DWL is folded or not, dummy row 310 may include the same number of dummy memory cells as included in each of the n rows in memory array 305 so that the word line development time is accurately modeled by the dummy word line DWL. The assertion of the dummy word line then couples a pair of dummy bit lines DBL and DBLB to one or more dummy memory cells 330 (which may also be designated as tracking cells). The dummy bit lines DBL and DBLB are loaded by dummy load cells 335 as discussed further below.

Figure 4:
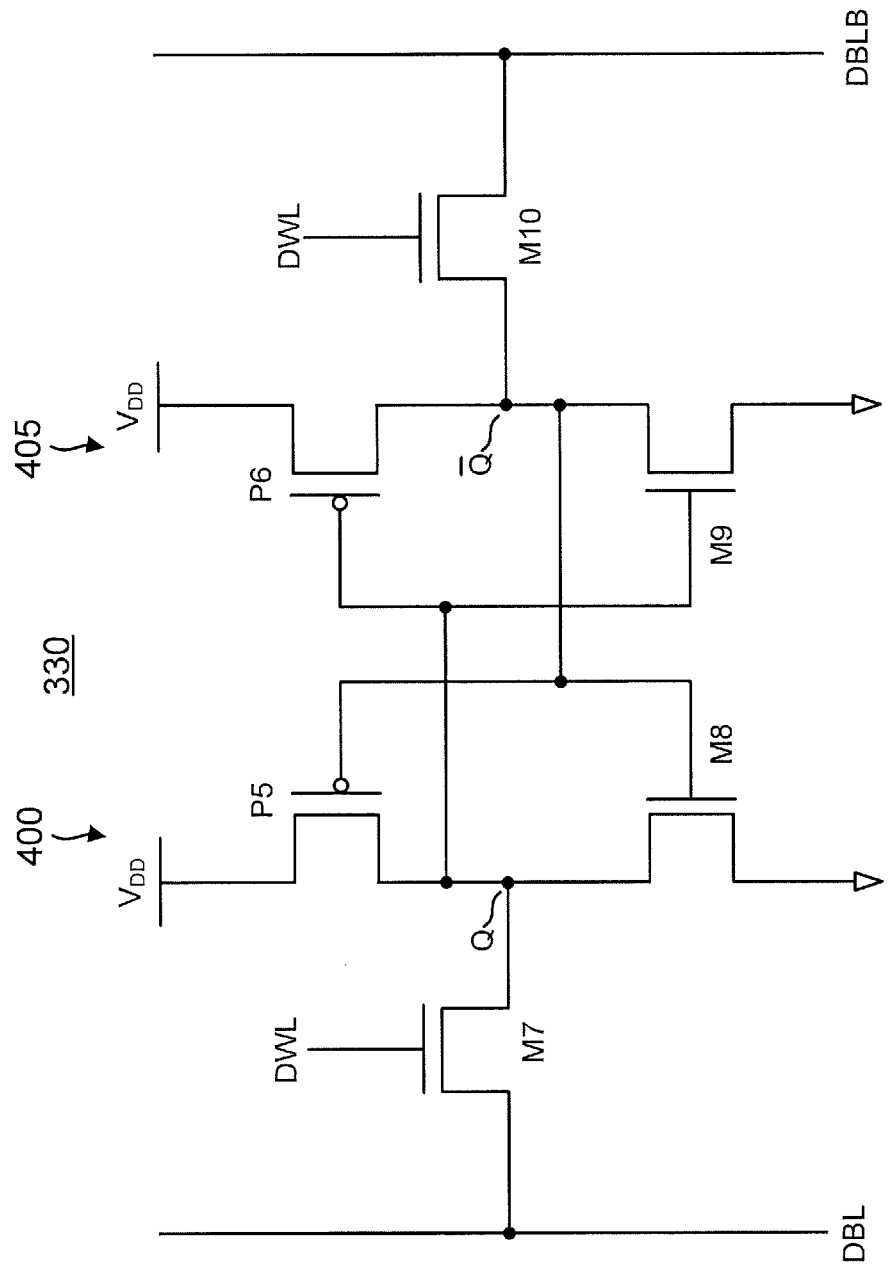
FIG. 4 is a diagram of a dummy memory cell in accordance with an aspect of the disclosure.

An example SRAM dummy memory cell 330 is shown in FIG. 4. Dummy memory cell 330 includes a pair of cross-coupled inverters 400 and 405. Inverter 400 includes a PMOS transistor P5 having a source coupled to the power supply node and a drain coupled to a Q output node for dummy memory cell 330. This Q output node provides the Q signal to write detect circuit 200 as discussed earlier. The drain of transistor P5 for inverter 400 also couples to a drain of an NMOS transistor M8 having its source tied to ground. A PMOS transistor P6 and an NMOS transistor M9 for inverter 405 are arranged analogously except that the output of inverter 405 is the complement Q output node for dummy memory cell 330. An NMOS dummy access transistor M7 couples between the Q output node for dummy memory cell 330 and the dummy bit line DBL. Similarly, an NMOS dummy access transistor M10 couples between the complement Q output node for memory cell 330 and the complement dummy bit line DBLB. The dummy word line DWL drives the gate of dummy access transistors M7 and M10.

Figure 3:
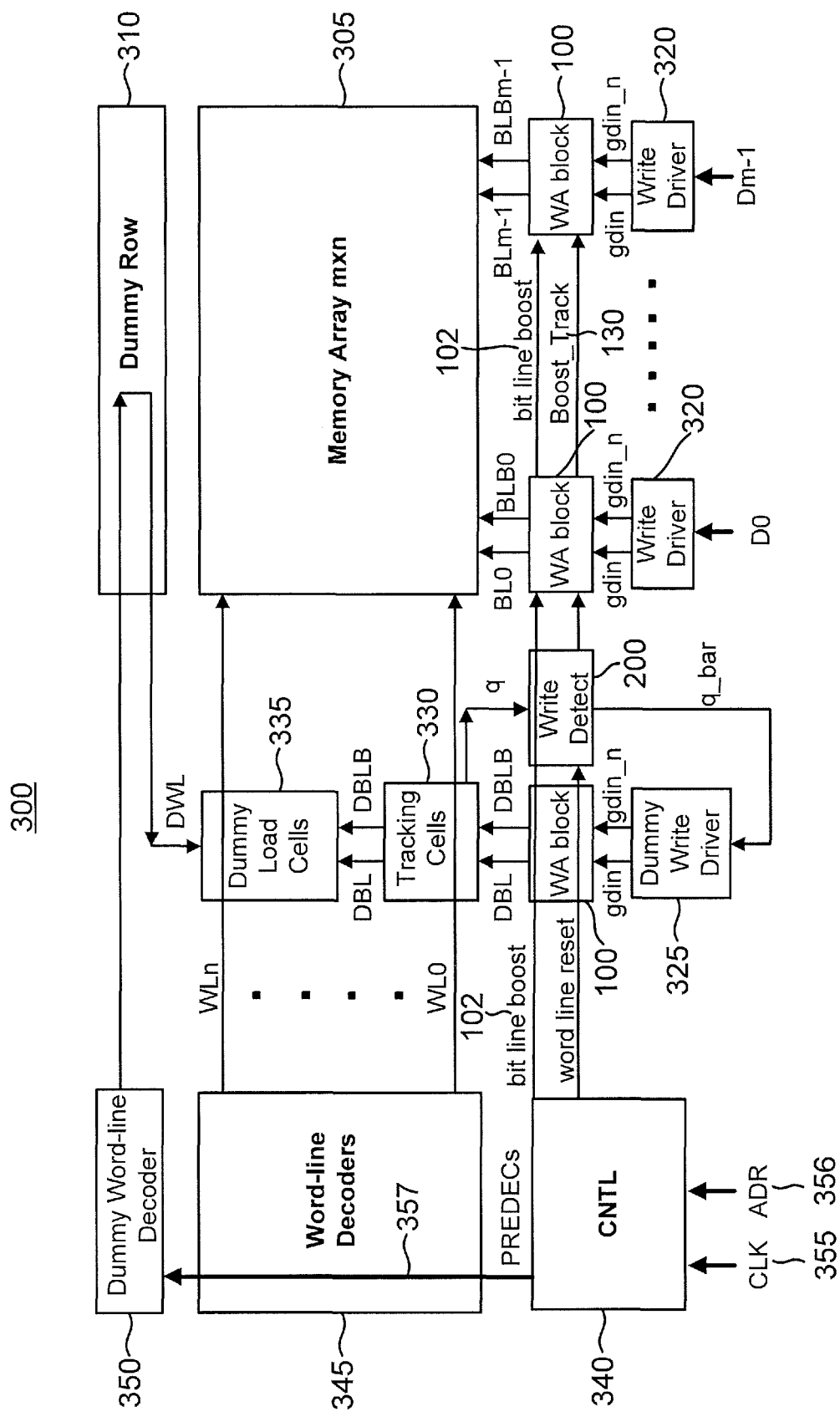
FIG. 3 is a diagram of a memory including the write assist circuit of FIG. 1 and the write detect circuit of FIG. 2 in accordance with an aspect of the disclosure.

Inverters 400 and 405 as well as dummy access transistors M7 and M10 are sized to match the corresponding devices in the bitcells in array 305 of FIG. 3. In this fashion, dummy memory cell 330 accurately models the time necessary to complete a successful write operation. To average out errors, a plurality of dummy memory cells 330 may be arranged in parallel between the dummy bit lines DBL and DBLB in alternative implementations. These dummy memory cells 330 would then drive the Q signal in common. Referring again to FIG. 3, the Q signal from dummy memory cell(s) 330 is received at write detect circuit 200 so that the binary transition in the Q signal responsive to a completion of a successful modeled write operation may trigger the active-low assertion of boost track signal 130 to reset the negative bit line boost. To assure a binary transition for the Q output signal upon every modeled write operation, a dummy write driver circuit 325 that generates dummy write signals gdin and gdin_n for driving dummy bit lines DBL and DBLB is configured to be responsive to the complement Q signal from write detect circuit 200. To model the bit line loading that occurs in memory array 305, dummy bit lines DBL and DBLB may be loaded by dummy load cells 335. Like dummy memory cell 330, dummy load cells 335 are replicas of the memory cells used in memory array 305 but do not have their gates driven by the dummy word line DWL. Dummy load cells 335 are thus included to mimic the capacitive loading of the bit lines that depends upon the number of rows in memory array 305. To further increase the accuracy of the simulated write operation, an additional write assist circuit 100 may also drive dummy bit lines DBL and DBLB. This additional write assist circuit 100 is configured as discussed with regard to FIG. 1.

The collection of dummy word line decoder 350, dummy word line DWL, dummy load cells 335, dummy memory cells 330 as well as corresponding write assist circuit 100 and dummy write driver 325 may be deemed to comprise a means for modeling a write operation to selected ones of the memory cells in array 305, wherein the means is configured to cause a binary transition in the dummy memory cell output signal responsive to a completion of the write operation.

The negative bit line boosts provided by its write assist circuits 100 are all appropriately timed regardless of the process, voltage, and temperature corner. Moreover, this timing is independent of the memory size as well. For example, should a particular instantiation of memory 300 include a relatively large number of rows in memory array 305, the resulting capacitive loading for its bit lines is modeled by dummy bit lines DBL and DBLB as well as through dummy load cells 335. The address decoding delay for word line decoders 345 is also modeled as well as the word line development time. An example method of operation will now be addressed.

Figure 5:
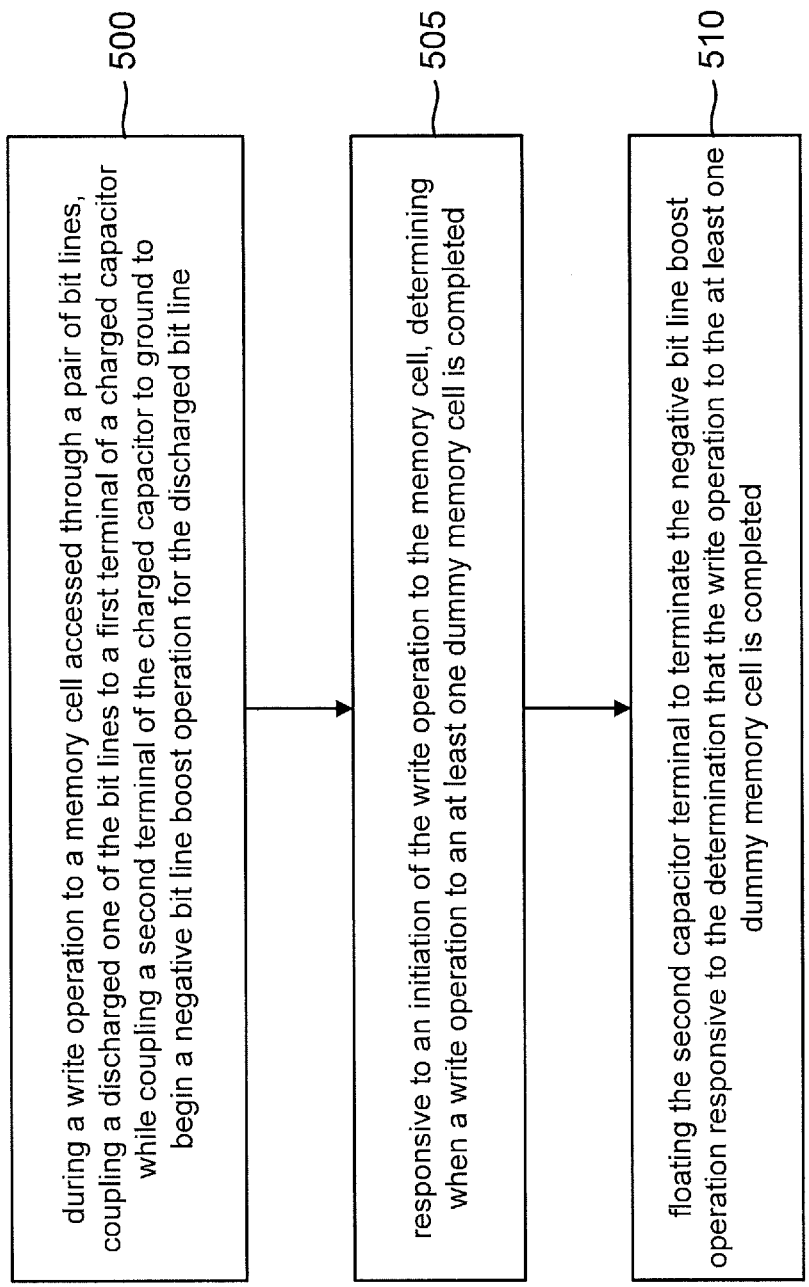
FIG. 5 is a flowchart for an adaptive negative bit line boost method in accordance with an aspect of the disclosure.

An example flowchart for an adaptive negative bit line boost method is shown in FIG. 5. The method includes an act 500 that occurs during a write operation to a memory cell accessed through a pair of bit lines and comprises coupling a discharged one of the bit lines to a first terminal of a charged capacitor while coupling a second terminal of the charged capacitor to ground to begin a negative bit line boost operation for the discharged bit line. The assertion of bit line negative boost signal 102 to trigger the negative boost to cap boost terminal 125 (which in turn provides a negative boost to the discharged bit line) as discussed with regard to write assist circuit 200 is an example of act 500.

The method also includes an act 505 that is responsive to an initiation of the write operation to the memory cell and comprises determining when a write operation to an at least one dummy memory cell is completed. The modeling of the write operation by dummy memory cell(s) 330 is an example of act 505.

Finally, the method includes an 510 that comprises floating the second capacitor terminal to terminate the negative bit line boost operation responsive to the determination that the write operation to the at least one dummy memory cell is completed. The active-low assertion of boost track signal 130 to to write assist circuit 100 so as to cutoff ground to inverter 120 and thus float the anode of capacitor C as discussed with regard to FIG. 1 is an example of act 510.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof but rather, should be fully commensurate with that of the claims appended hereafter and their functional equivalents.

I claim:

1. A memory, comprising:
   a bit line pair; and
   a write assist circuit including:
      a capacitor having a first terminal coupled to a negative bit line boost terminal for providing a negative bit line boost to a discharged bit line in the bit line pair;
      a first inverter having an output coupled to a second terminal of the capacitor, the inverter having a ground terminal; and
      a switch coupled between the ground terminal and ground, the switch being configured to switch off responsive to an assertion of a boost track signal to cause the second terminal of the capacitor to float to terminate the negative bit line boost to the discharged bit line.

2. The memory of claim 1, further comprising:
   a memory cell coupled to the bit line pair through a pair of access transistors;
   at least one dummy memory cell configured to electrically model a write operation to the memory cell;
   a write detect circuit configured to assert the boost track signal responsive to a completion of the modeled write operation on the at least one dummy memory cell.

3. The memory of claim 2, further comprising:
   a memory word line configured to drive a gate for each of the access transistors;
   a pair of dummy bit lines configured to electrically model the pair of bit lines; and
   a dummy word line configured to electrically model a word line development time for the memory word line, wherein the at least one dummy memory cell includes a pair of dummy access transistors configured to have their gates driven by the dummy word line to couple to the dummy memory cell to the pair of dummy bit lines.

4. The memory of claim 2, wherein the dummy memory cell includes a pair of cross-coupled inverters, and wherein one of the cross-coupled inverters is configured to drive a dummy memory cell output signal; and wherein the write detect signal is configured to assert the boost track signal responsive to a binary transition of the dummy memory cell output signal.

5. The memory of claim 4, wherein the write detect circuit includes a serial chain of inverters configured to output a delayed version of the dummy memory cell output signal and a delayed version of a complement dummy memory cell output signal.

6. The memory of claim 4, wherein the write detect circuit includes a first inverter configured to switch on responsive to an assertion of the dummy memory cell output signal and a second inverter configured to switch off responsive to an assertion of a complement dummy memory output signal.

7. The memory of claim 4, wherein the write detect circuit includes a latch configured to latch the boost track signal.

8. The memory of claim 7, wherein the write detect circuit is configured to charge the boost track signal to a power supply voltage responsive to an assertion of a word line reset signal.

9. The memory of claim 8, wherein the latch includes an inverter having a latch ground terminal coupled to a switch configured to couple the latch ground terminal to ground responsive to an assertion of the word line reset signal.

10. The memory of claim 2, wherein the boost track signal is an active-low signal, and wherein the write detect signal is configured to ground the boost track signal during its assertion.

11. A method, comprising:
during a write operation to a memory cell accessed through a pair of bit lines, coupling a discharged one of the bit lines to a first terminal of a charged capacitor while coupling a second terminal of the charged capacitor to ground to begin a negative bit line boost operation for the discharged bit line;
responsive to an initiation of the write operation to the memory cell, determining when a write operation to an at least one dummy memory cell is completed; and
floating the second capacitor terminal to terminate the negative bit line boost operation responsive to the determination that the write operation to the at least one dummy memory cell is completed.

12. The method of claim 11, wherein the determining when the write operation is completed uses a plurality of dummy memory cells coupled in parallel between a pair of dummy bit lines.

13. The method of claim 11, wherein floating the second terminal of the capacitor comprises isolating a ground terminal from ground for an inverter coupled to the second terminal of the capacitor.

14. The method of claim 11, wherein determining when the write operation to the at least one dummy memory cell is completed includes modeling a word line development period using a dummy word line.

15. The method of claim 12, wherein determining when the write operation to the at least one dummy memory cell is completed includes loading the pair of dummy bit lines to match a capacitive load for the pair of bit lines.

16. The method of claim 12, wherein determining when the write operation to the at least one dummy memory cell is completed comprises detecting a binary transition in a dummy memory output signal from at least one dummy memory cell.

17. A memory comprising:
a bit line pair;
a capacitor;
first means for coupling a terminal of the capacitor to ground to initiate a negative bit line boost operation responsive to an assertion of a negative boost signal and for floating the terminal to terminate the negative bit line boost operation responsive to an assertion of a boost track signal;
second means for modeling a write operation to a memory cell, wherein the second means is configured to cause a binary transition in a dummy memory cell output signal responsive to a completion of the write operation; and
third means for asserting the boost track signal responsive to the binary transition in the dummy memory cell output signal.

18. The memory of claim 17, wherein the memory cell is a static random access memory (SRAM) cell.

19. The memory of claim 18, wherein the third means is further configured to charge the boost track signal to a power supply voltage responsive to an assertion of a word line reset signal.

20. The memory of claim 19, wherein the third means includes a latch configured to latch the boost track signal.

* * * * *